(12) United States Patent
Hsu et al.

(10) Patent No.: US 7,089,660 B2
(45) Date of Patent: Aug. 15, 2006

(54) METHOD OF FABRICATING A CIRCUIT BOARD

(75) Inventors: Shih-Ping Hsu, Hsin-chu (TW); Chien-Chih Chen, Hsin-chu (TW); Yi-San Wang, Hsin-chu (TW)

(73) Assignee: Phoenix Precision Technology Corporation, (TW)

( * ) Notice: Subject to any disclaimer, the term of this patent is extended or adjusted under 35 U.S.C. 154(b) by 0 days.

(21) Appl. No.: 10/950,789

(22) Filed: Sep. 28, 2004

(65) Prior Publication Data

US 2005/0284655 A1 Dec. 29, 2005

(30) Foreign Application Priority Data

Jun. 29, 2004 (TW) ................. 93118978 A

(51) Int. Cl.
*H05K 3/36* (2006.01)
(52) U.S. Cl. ................ 29/830; 29/825; 29/833; 29/852
(58) Field of Classification Search ............ 29/825, 29/830, 846, 833, 852
See application file for complete search history.

(56) References Cited

FOREIGN PATENT DOCUMENTS

| JP | 07066557 A | * | 3/1995 |
| JP | 2003179330 A | * | 6/2003 |

* cited by examiner

*Primary Examiner*—Carl J. Arbes
(74) *Attorney, Agent, or Firm*—Clark & Brody; William F. Nixon

(57) ABSTRACT

A circuit board with an asymmetrical structure and a method for fabricating the same are proposed. A core circuit board is provided, with a build-up structure being formed on a side of the core circuit board, and a laminated structure being formed on an opposite side of the core circuit board, such that the build-up structure and laminated structure on two sides of the core circuit board can be mutually balanced. Then, the build-up process and the laminated process can be repeated on the two sides of the core circuit board to form more build-up structures and at least one more laminated structure having preferable rigidity to counteract warpage of the core circuit board caused by fabrication of the build-up structures, wherein the number of the build-up structures can be larger than the number of the laminated structures thereby forming a circuit board with an asymmetrical structure.

16 Claims, 7 Drawing Sheets

METHOD OF FABRICATING A CIRCUIT BOARD

FIELD OF THE INVENTION

The present invention relates to circuit boards with asymmetrical structures and methods for fabricating the same, and more particularly, to a multi-layer circuit board having an asymmetrical circuit build-up structure, and a method for fabricating the circuit board.

BACKGROUND OF THE INVENTION

Along with the blooming development in the electronic industry, electronic products tend to be made compact in size and with high performances, multiple functions and high speed. In order to satisfy the requirements for high integration and miniaturization of semiconductor devices, circuit boards for carrying a plurality of active/passive components and circuits have evolved from double-layer boards to multi-layer boards, such that in the condition of a limited space occupied by the multi-layer circuit board, the useful circuit area of the circuit board can be enlarged using the interlayer connection technology, so as to desirably achieve a high density arrangement of integrated circuits in the multi-layer circuit board.

A conventional multi-layer circuit board is generally fabricated by a laminated method or a build-up method.

FIGS. 1A to 1C show the procedural steps of a conventional laminated method for fabricating a multi-layer circuit board. As shown in FIG. 1A, first, a plurality of circuit boards 11, 12, 13 are prepared each made of copper foils and insulating substrate materials. The circuit board 11 serves as a core circuit board having upper and lower circuit layers 11a, 11b and a plurality of conductive vias 11c. The circuit boards 12, 13 each has a circuit layer 12a, 13a on a side thereof and a conductive metal layer 12c, 13c on another side thereof opposite to the circuit layer 12a, 13a. Next, a prepreg 14 made of fiber or thermosetting resin (such as epoxy resin, phenolic polyester and the like) serves as an adhesive layer to be respectively disposed between the circuit boards 11 and 12 and between the circuit boards 11 and 13. Then, laminating and heat press processes are performed to attach and stack the circuit boards 11, 12, 13 together to form a multi-layer junction board, as shown in FIG. 1B. A drilling process is carried out to form a plurality of through holes in the multi-layer junction board, and a conductive metal layer is plated on inner wall of the through holes to form plated through holes 15. Finally, as shown in FIG. 1C, a patterning process is performed on the outermost conductive metal layers 12c, 13c to fabricate patterned circuit layers 12b, 13b, such that the circuit boards 11, 12, 13 can be electrically interconnected via the plated through holes 15, thereby fabricating a multi-layer circuit board 10 having six circuit layers.

FIGS. 2A to 2E show the procedural steps of a conventional build-up method for fabricating a multi-layer circuit board. As shown in FIG. 2A, a core circuit board 21 is first prepared comprising a resin core layer 211 having a predetermined thickness and circuit layers 212 respectively formed on top and bottom surfaces of the resin core layer 211, wherein a plurality of plated through holes 213 are formed in the resin core layer 211 to electrically interconnect the circuit layers 212 on the top and bottom surfaces of the resin core layer 211. As shown in FIG. 2B, a build-up process is performed to apply an insulating layer 22 respectively on the top and bottom surfaces of the core circuit board 21, and a plurality of blind holes 23 are provided in each insulating layer 22 and reach the corresponding circuit layer 212. As shown in FIG. 2C, a metallic conductive film 24 is coated over each insulating layer 22 and an inner wall of each blind hole 23. Then a resist layer 25 is disposed on each metallic conductive film 24 and is formed with a plurality of openings 250 to expose a predetermined portion of the corresponding metallic conductive film 24 for subsequently forming patterned circuits. As shown in FIG. 2D, an electroplating process is carried out to form a patterned circuit layer 26 and a plurality of conductive blind holes 23a in the openings 250 of each resist layer 25, allowing the circuit layer 26 to be electrically connected to the circuit layer 212 via the conductive blind hole 23a. Then, the resist layer 25 and the portion of the conductive film 24 covered by the resist layer 25 are removed by etching. This thereby forms a build-up structure 20a. Similarly, as shown in FIG. 2E, the above procedural steps can be repeated to form another build-up structure 20b on the build-up structure 20a so as to gradually form more build-up structures and fabricate a multi-layer circuit board 20.

However, by employing either the aforementioned laminated method or build-up method to fabricate a multi-layer circuit board, generally in order to avoid warpage of the circuit board caused by unbalanced forces exerted on the circuit board during the process of stacking the circuit structures, it is necessary to perform simultaneously the stacking process on the top and bottom surfaces of the core circuit board, thereby forming a circuit board having a symmetrical circuit stacking structure.

Furthermore, along with the growth of portable communication, network and computer products, semiconductor packages having a high density and multiple pins, such as Ball Grid Array (BGA), Flip Chip, Chip Size Package (CSP) and Multi Chip Module (MCM) packages, have become the mainstream products on the semiconductor market. Thus, the chip mounting side of the circuit board should be formed with high-density and fine circuits to be suitable for highly integrated semiconductor chips. Correspondingly, another side of the circuit board for being mounted to an external electronic device may not be necessary to have such high circuit density as the chip mounting side thereof. However, since a symmetrical stacking process needs to be adopted to fabricate the conventional circuit stacking structure, that is, the circuit stacking process should be simultaneously perform on the top and bottom surfaces of the core circuit board, the side of the circuit board for being mounted to the external electronic device, not requiring a high circuit density, would also be subject to the same process for stacking multiple circuit layers as the chip mounting side of the circuit board, thereby causing a waste of material and undue consumption of the fabrication processes and cost.

SUMMARY OF THE INVENTION

In light of the above drawbacks in the prior art, an objective of the present invention is to provide a circuit board with an asymmetrical structure and a method for fabricating the same, so as to reduce the fabrication material and cost.

Another objective of the present invention is to provide a circuit board with an asymmetrical structure and a method for fabricating the same, for simplifying the fabrication processes.

Still another objective of the present invention is to provide a circuit board with an asymmetrical structure and a method for fabricating the same, for increasing the fabrication yield.

A further objective of the present invention is to provide a circuit board with an asymmetrical structure and a method for fabricating the same, which can effectively prevent warpage of the circuit board caused by the fabrication processes of the asymmetrical circuit board.

In order to achieve the above and other objectives, the present invention proposes a method for fabricating a circuit board with an asymmetrical structure, comprising the steps of: providing a core circuit board; and performing a build-up process to form a build-up structure on a side of the core circuit board, and performing a laminated process to form a laminated structure on another side of the core circuit board opposite to the side having the build-up structure, such that the build-up structure and the laminated structure formed on two opposite sides of the core circuit board can be balanced mutually to counteract warpage of the core circuit board during fabrication. The build-up process can be performed prior to the laminated process; alternatively, the laminated process may be performed prior to the build-up process. The build-up process and the laminated process can be repeated on the two sides of the core circuit board so as to form more build-up structures on the build-up structure on the side of the core circuit board, and form at least one more laminated structure having preferable rigidity on the opposite side of the core circuit board to mutually balance the build-up structures and prevent warpage of the core circuit board. The number of the build-up structures on the core circuit board may be larger than the number of the laminated structures so as to form a circuit board with an asymmetrical structure.

According to the foregoing fabrication processes, the present invention discloses a circuit board with an asymmetrical structure comprising: a core circuit board; a plurality of build-up structures stacked on a side of the core circuit board; and at least one laminated structure formed on another side of the core circuit board opposite to the side having the build-up structures so as to counteract warpage of the core circuit board caused by the build-up structures. The build-up structure can be fabricated by forming a layer of a non-fiber resin material on a side of the core circuit board, such as ABF (Ajinomoto Build-up Film, a trade name and produced by Ajinomoto Co. Inc., Japan), to allow a patterned circuit layer having fine circuits to be effective attached to the non-fiber resin material layer since the non-fiber resin material is softness and capable of producing uniform roughness, such that the patterned circuit layer is suitable for mounting highly integrated electronic components thereon. The laminated structure formed on an opposite side of the core circuit board comprises a fiber-resin prepreg material, such as a mixture of BT (Bismaleimide Triazine) resin and glass fiber, or a mixture of epoxy resin and glass fiber (FR4), and so on, which has satisfactory rigidity, high reliability and a small coefficient of thermal expansion (CTE) etc., such that relatively less layers of the prepreg material are sufficient to provide preferable rigidity and mutually balance the build-up structure. Moreover, the relatively less laminated structures may serve as a side of the circuit board for being mounted to an external electronic device, thereby reducing the fabrication cost and simplifying the fabrication processes.

Therefore, compared to the circuit stacking process in the prior art, the present invention not only forms a circuit board with an asymmetrical structure, which can effectively reduce the number of build-up structures on a side of the circuit board for being mounted to an external device thereby decreasing the fabrication cost and simplifying the fabrication processes, but also uses the laminated structure having relatively greater rigidity on an opposite side of the circuit board to counteract or mutually balance the build-up structures so as to prevent warpage of the circuit board.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

FIGS. 3A to 3E show the procedural steps of a method for fabricating a circuit board with an asymmetrical structure according to a first preferred embodiment of the present invention. It should be noted that the drawings are made in simplicity for the only purpose of illustrating the structure of the circuit board in the present invention. The drawings merely show the components or parts relating to the disclosure of the present invention but not the practically fabricated product. It should be understood that the number, shape and size of the components or parts are more flexibility arranged and the layout of the circuit board is more complex in practice.

Figure 1A:
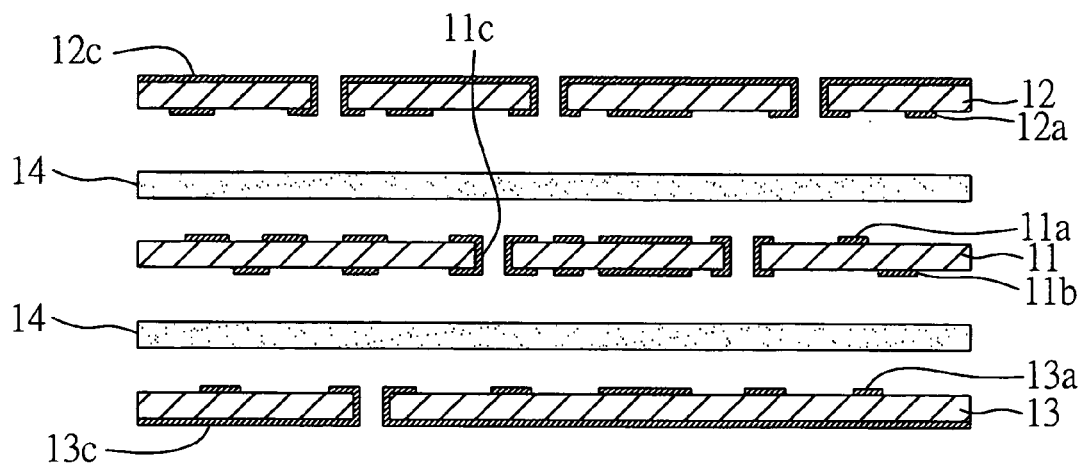
FIGS. 1A to 1C (PRIOR ART) are cross-sectional schematic diagrams showing the procedural steps of a conventional laminated method for fabricating a multi-layer circuit board.
Figure 1B:
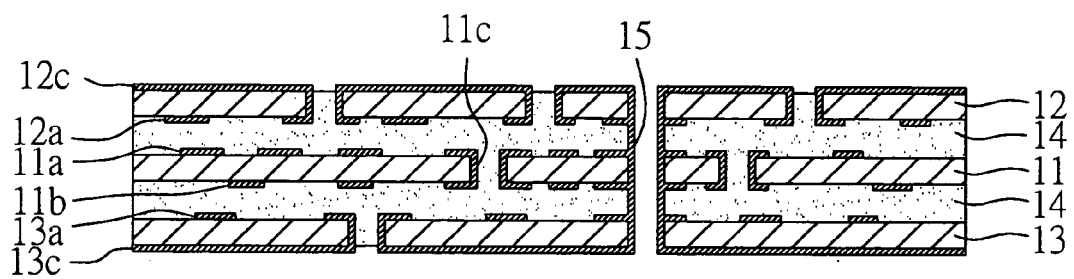
Figure 1C:
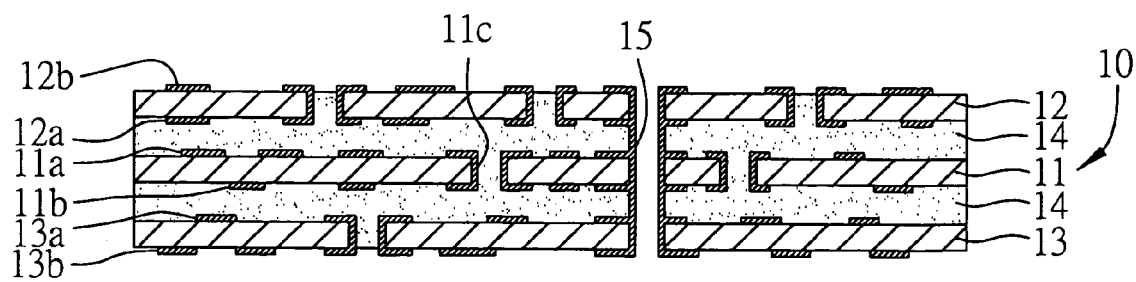
Figure 2A:
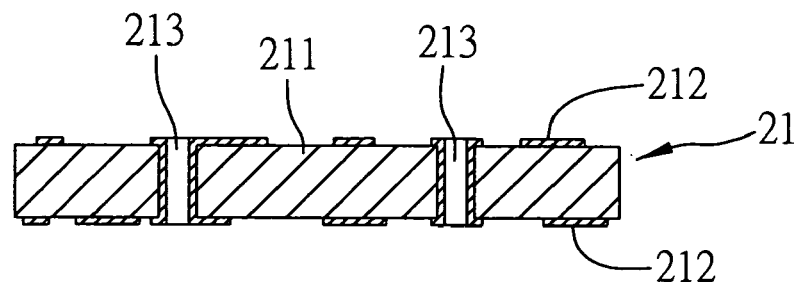
FIGS. 2A to 2E (PRIOR ART) are cross-sectional schematic diagrams showing the procedural steps of a conventional build-up method for fabricating a multi-layer circuit board.
Figure 2B:
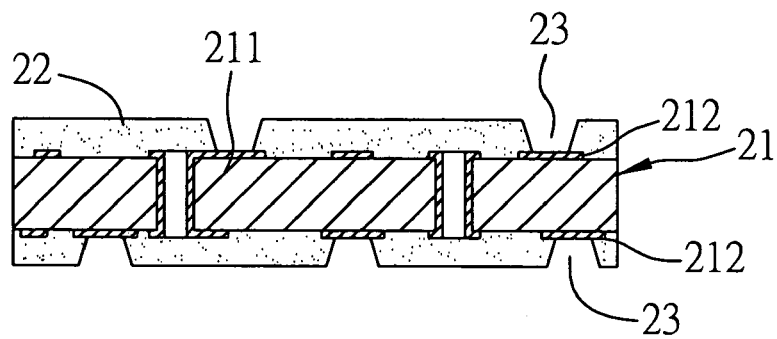
Figure 2C:
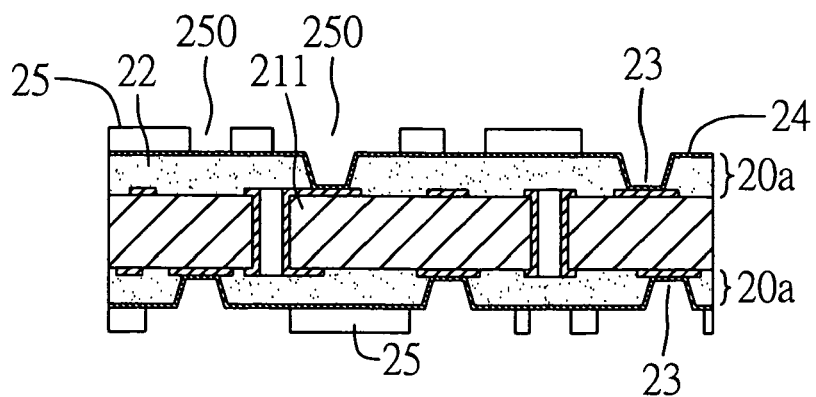
Figure 2D:
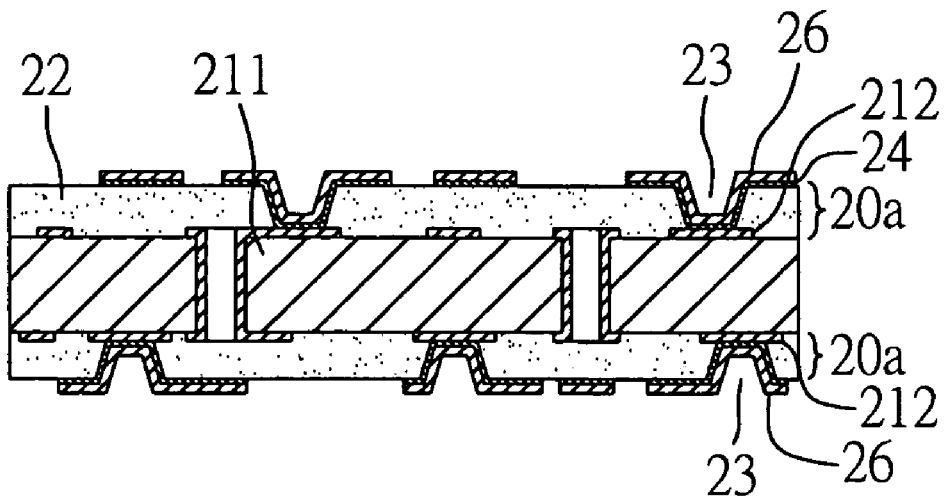
Figure 2E:
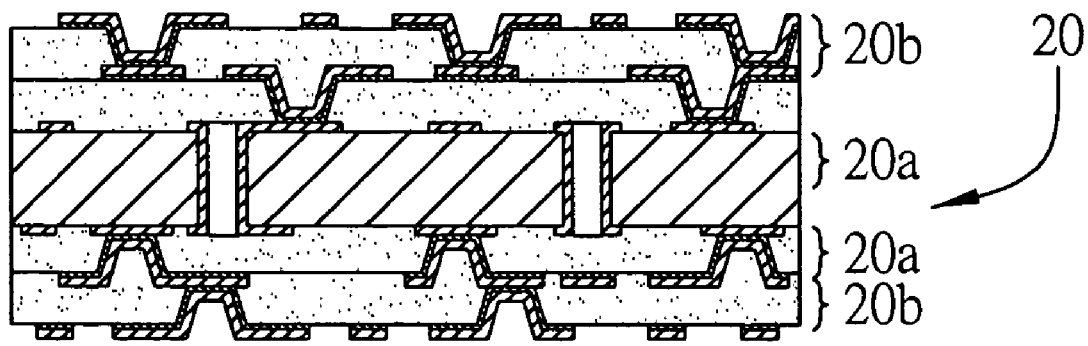
Figure 3A:
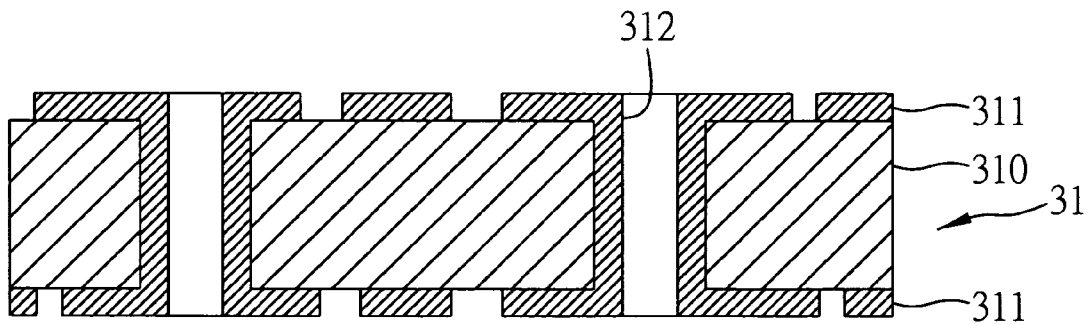
FIGS. 3A to 3E are cross-sectional schematic diagrams showing the procedural steps of a method for fabricating a circuit board with an asymmetrical structure according to a first preferred embodiment of the present invention.

Referring to FIG. 3A, first, a core circuit board 31 is provided, which comprises a insulating layer 310 and a plurality of patterned circuit layers 311 formed on surfaces of the insulating layer 310 respectively, wherein a plurality of plated through holes 312 are formed in the insulating layer 310 and electrically interconnect the patterned circuit layers 311. In this embodiment, the core circuit board 31 is shown only for the purpose of illustration, and the electrical connection between the circuit layers 311 is not limited to the use of plated through holes 312. Further, the core circuit board 31 may also be a pre-treated multi-layer circuit board. And fabrication of the core circuit board 31 employs conventional technology, thereby not to be further detailed here.

Figure 3B:
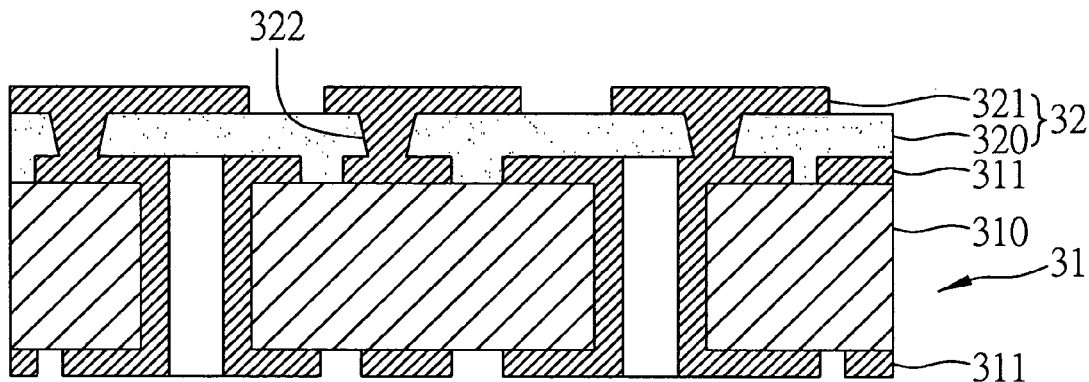

Referring to FIG. 3B, a build-up process is performed to form a first build-up structure 32 on a side of the core circuit board 31, the first build-up structure 32 comprising an insulating layer 320 and a patterned circuit layer 321. The patterned circuit layer 321 is electrically connected via a plurality of conductive blind holes 322 to the circuit layer 311 on the surface of the core circuit board 31. The insulating layer 320 of the first build-up structure 32 can be made of a non-fiber resin material such as ABF (Ajinomoto Build-up Film), wherein the non-fiber resin material is soft and capable of producing uniform roughness, thereby making the patterned circuit layer 321 having fine circuits able to be effectively attached thereto. The build-up structure 32 is fabricated by first forming an insulating layer 320 or an insulating layer coated with a metal film (not shown) on the core circuit board 31; then forming in order a conductive layer and a patterned resist layer (not shown) on the insulating layer 320; electroplating a patterned circuit layer 321 in openings of the patterned resist layer; and finally removing the patterned resist layer and the conductive layer underneath the patterned resist layer. Alternatively, the build-up structure 32 can be fabricated by forming an insulating layer 320 or an insulating layer coated with a metal film (not shown) on the core circuit board 31; then forming in order a metal layer having a sufficient thickness and a patterned resist layer (not shown) on the insulating layer 320; etching the metal layer to form a patterned circuit layer 321; and finally removing the patterned resist layer.

Figure 3C:
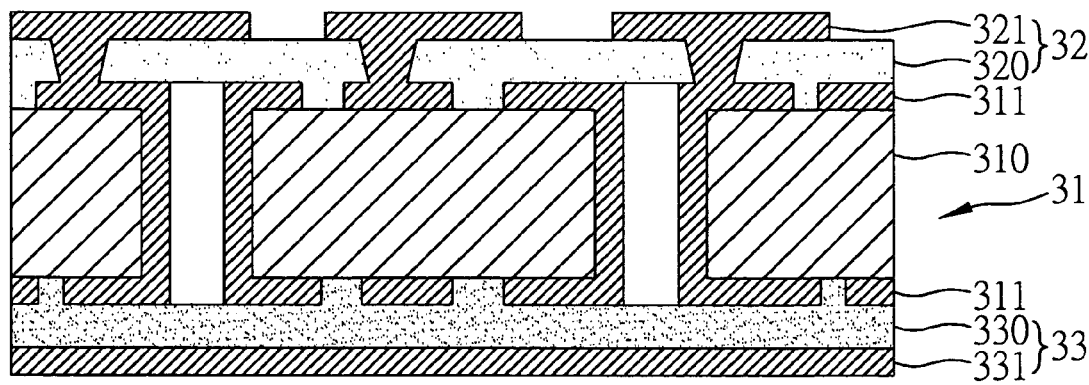

Referring to FIG. 3C, a laminated process is performed to form a laminated structure 33 on another side of the core circuit board 31 opposite to the side having the first build-up structure 32, wherein the laminated structure 33 comprises an insulating layer 330 and a metal layer 331. The insulating layer 330 of the laminated structure 33 can be made of a fiber-resin prepreg material, such as a mixture of BT (Bismaleimide Triazine) resin and glass fiber, or a mixture of epoxy resin and glass fiber (FR4), and so on. This prepreg material has satisfactory rigidity, high reliability and a small coefficient of thermal expansion (CTE), such that relatively less layers of the prepreg material are sufficient to provide preferable rigidity and counteract warpage of the core circuit board caused by forming the build-up structure on the opposite side of the core circuit board.

Figure 3D:
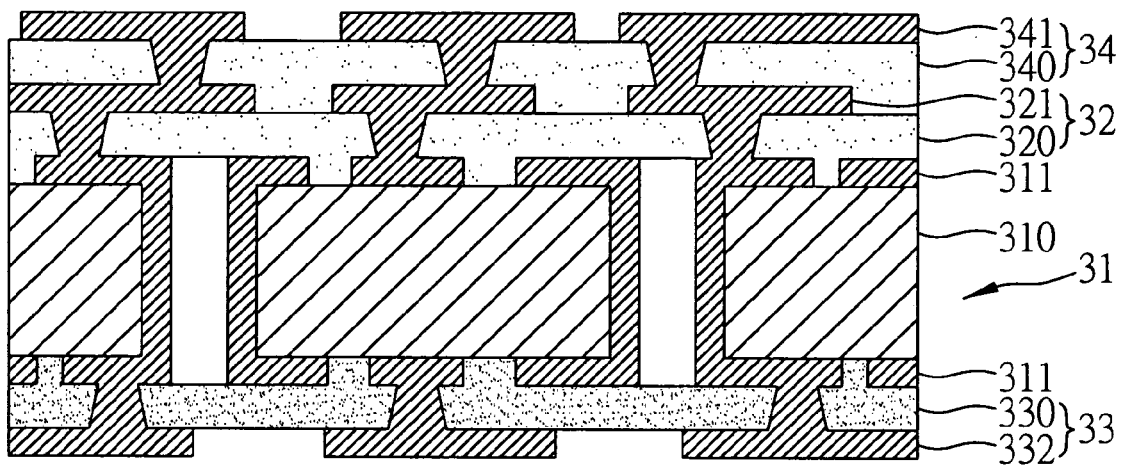

Referring to FIG. 3D, the build-up process is repeated to form a second build-up structure 34 on the first build-up structure 32 of the core circuit board 31, wherein the second build-up structure 34 comprises an insulating layer 340 and a patterned circuit layer 341. The insulating layer 340 of the second build-up structure 34 can be made of the same non-fiber resin material as the first build-up structure 32. After formation of the patterned circuit layer 341 of the second build-up structure 34, the metal layer 331 of the laminated structure 33 on the other side of the core circuit board 31 can be patterned to form a patterned circuit layer 332. On the other hand, in case of using etching process to form the patterned circuit layer of the build-up structure, during formation of the patterned circuit layer 341 of the second build-up structure 34, the metal layer 331 of the laminated structure 33 on the other side of the core circuit board 31 may also be simultaneously patterned to form a patterned circuit layer 332. Depending on the practical requirements, the build-up process can be continuously repeated on the side of the core circuit board having the build-up structures. Moreover, more laminated structures can be formed on the other side of the core circuit board for counteracting the warpage of the core circuit board caused by fabrication of the above build-up structures. The number of built-up structures on a side of the core circuit board may be larger than the number of laminated structures on an opposite side of the core circuit board, thereby forming a circuit board with an asymmetrical structure.

Figure 3E:
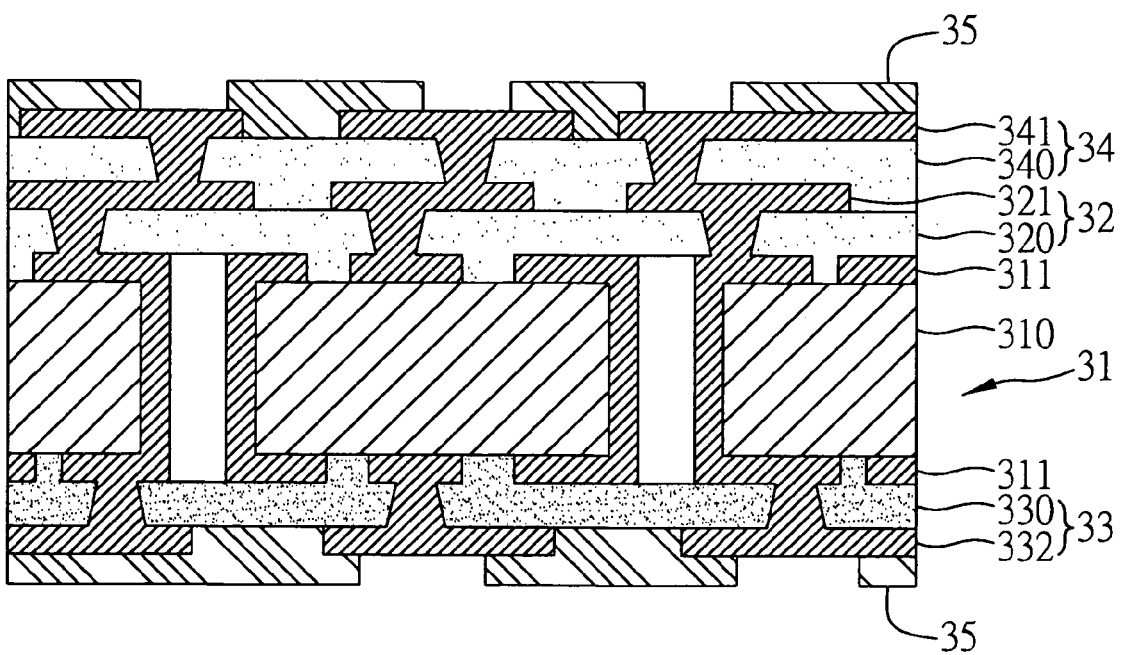

Referring to FIG. 3E, a patterned insulating layer such as solder mask 35 can be formed respectively on the circuit layers 341, 332 of the second build-up structure 34 and laminated structure 33 on the core circuit board 31, so as to protect the circuit layers 341, 332 against damage from the external environment via the solder mask 35.

In addition, in the above description, the build-up process is performed before the laminated process on the core circuit board. It should be noted that by the present invention, alternatively, the laminated process may be carried out prior to the build-up process, such that the relatively more rigid laminated structure can mutually balance the build-up structure to prevent warpage of the core circuit board.

Accordingly, as shown in FIG. 3D, by the above fabrication method, the present invention discloses a circuit board with an asymmetrical structure, comprising: a core circuit board 31; a plurality of build-up structures 32, 34 stacked on a side of the core circuit board 31; and at least one laminated structure 33 formed on an opposite side of the core circuit board 31 to counteract warpage caused by fabrication of the build-up structures 32, 34. Since the insulating layers 320, 340 of the build-up structures 32, 34 on a side of the core circuit board 31 are made of a non-fiber resin material (such as ABF) producing uniform roughness, the patterned circuit layers 321, 341 having fine circuits can be effectively attached to the insulating layers 320, 340 and thus are suitable for mounting highly integrated electronic components thereon. The insulating layer 330 of the laminated structure 33 on an opposite side of the core circuit board 31 is made of a fiber-resin prepreg material (such as a mixture of BT resin and glass fiber) having relatively high rigidity to counteract warpage caused by the build-up structures 32, 34. And the laminated structure 33 may be subsequently used to electrically connect the circuit board to an external electronic device. As a result, this completes fabrication for a circuit board with an asymmetrical structure, which has a side formed with a higher circuit density and more layers, and has an opposite side formed with a lower circuit density and less layers.

FIGS. 4A to 4D show the procedural steps of a method for fabricating a circuit board with an asymmetrical structure according to a second preferred embodiment of the present invention.

Figure 4A:
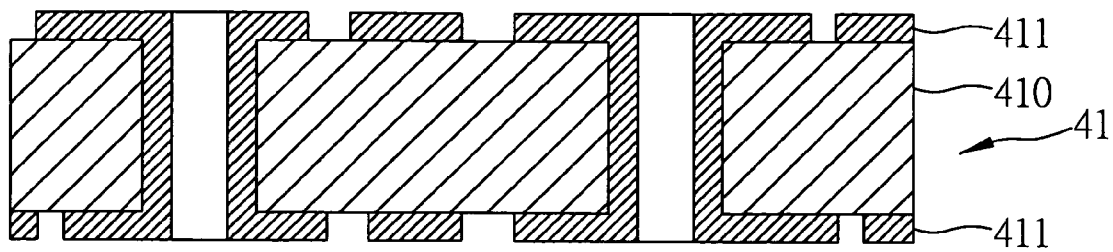
FIGS. 4A to 4D are cross-sectional schematic diagrams showing the procedural steps of a method for fabricating a circuit board with an asymmetrical structure according to a second preferred embodiment of the present invention.

Referring to FIG. 4A, first, a core circuit board 41 is provided, which comprises a insulating layer 410 and a plurality of patterned circuit layers 411 formed on surfaces of the insulating layer 410 respectively. The core circuit board 41 may also be a pre-treated multi-layer circuit board.

Figure 4B:
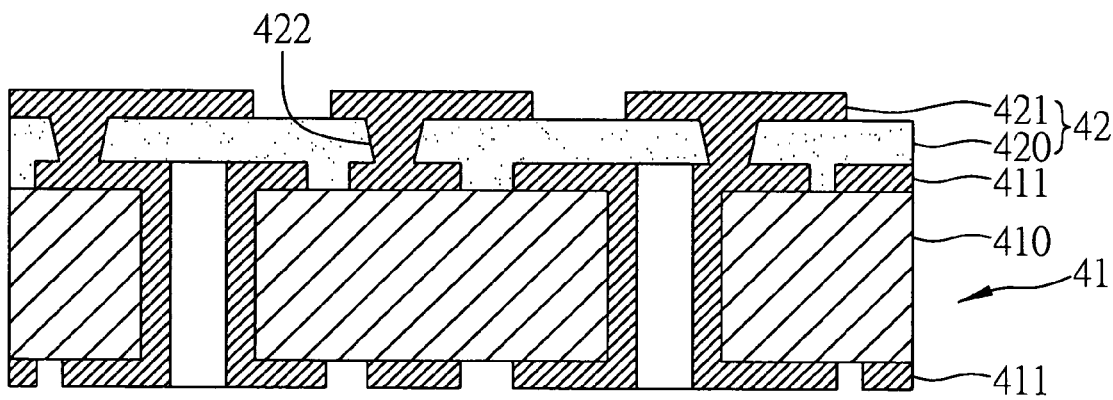

Referring to FIG. 4B, a build-up process is performed to form a first build-up structure 42 on a side of the core circuit board 41, the first build-up structure 42 comprising an insulating layer 420 and a patterned circuit layer 421. The patterned circuit layer 421 is electrically connected via a plurality of conductive blind holes 422 to the circuit layer 411 on the surface of the core circuit board 41. The insulating layer 420 of the first build-up structure 42 can be made of a non-fiber resin material such as ABF, wherein the non-fiber resin material is soft and capable of producing uniform roughness, thereby making the patterned circuit layer 421 having fine circuits able to be effectively attached thereto.

Figure 4C:
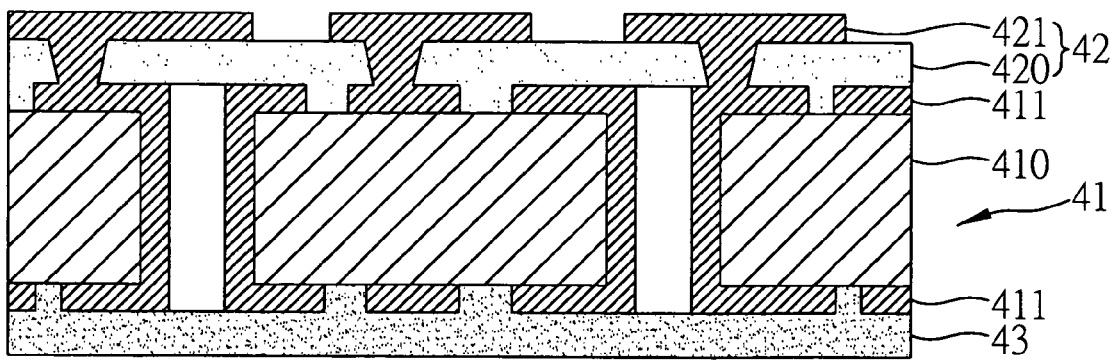

Referring to FIG. 4C, a laminated process is carried out to form a laminated structure 43 on another side of the core circuit board 41 opposite to the side having the first build-up structure 42. The laminated structure 43 can be an insulating layer structure having preferable rigidity, for example being made of a photosensitive polymeric material, so as to counteract warpage caused by fabrication of the build-up structure on the other side of the core circuit board.

Figure 4D:
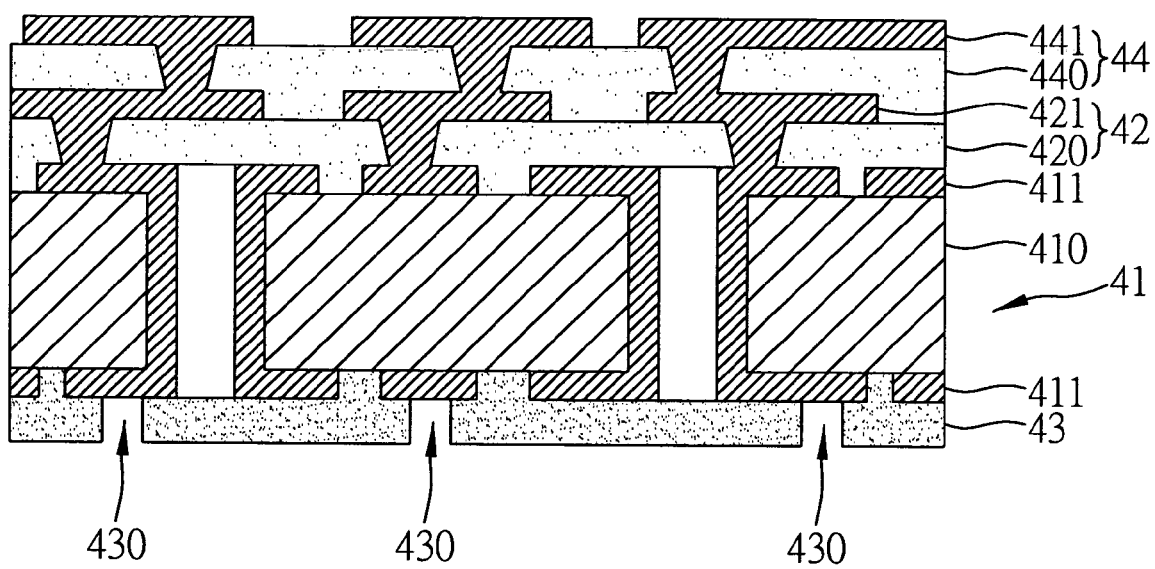

Referring to FIG. 4D, the build-up process can be repeated to form a second build-up structure 44 on the first build-up structure 42 of the core circuit board 41, the second build-up structure 44 comprising an insulating layer 440 and a patterned circuit layer 441. And then the exposing and developing techniques may also be used to pattern the photosensitive polymeric insulating layer of the laminated structure 43 on the other side of the core circuit board 41 so as to form a plurality of openings 430 in the laminated structure 43 to expose a portion of the patterned circuit layer 441 on the surface of the core circuit board 41. It should be understood that, the number of the build-up structures formed on the core circuit board are not limited to that shown in the drawing (i.e. two build-up structures shown). Practically, the build-up process can be continuously repeated on the side of the core circuit board depending on the requirement of electrically design for the circuit board. Moreover, a photosensitive polymeric insulating layer having a sufficient thickness is formed on the other side of the core circuit board to counteract warpage of the core circuit board caused by the build-up structures. This thereby fabricates a circuit board with an asymmetrical structure. Further, a plurality of conductive elements such as solder balls may be implanted at the portion of the circuit layer on the surface of the core circuit board exposed via the openings of the photosensitive polymeric insulating layer, so as to allow the circuit board to be electrically connected to an external electronic device via the solder balls.

Compared to the foregoing first embodiment, in this second embodiment on a side opposite to the side of the core circuit board with the build-up structures having a high circuit density and find circuits, there can be directly formed a patterned insulating layer having a plurality of openings to expose a portion of the patterned circuit layer on the surface of the core circuit board required for designing the circuit layout of the finally fabricated circuit board, such that the fabrication material, cost and procedural steps can be reduced or simplified. This thereby completes fabrication of a circuit board with an asymmetrical structure, which has a side formed with a higher circuit density and more layers, and has an opposite side formed with a lower circuit density and less layers.

Similarly, in the above description, the build-up process is performed before the laminated process on the core circuit board. It should be noted that by the present invention, alternatively, the laminated process may be carried out prior to the build-up process, such that the relatively more rigid laminated structure can mutually balance the build-up structure to prevent warpage of the core circuit board.

Therefore, compared to the circuit stacking process in the prior art, the present invention not only forms a circuit board with an asymmetrical structure, which can effectively reduce the number of build-up structures on a side of the circuit board for being mounted to an external device thereby decreasing the fabrication cost and simplifying the fabrication processes, but also uses the laminated structure on an opposite side of the circuit board to counteract or mutually balance the build-up structures so as to prevent warpage of the circuit board.

The present invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a circuit board with an asymmetrical structure, comprising the steps of:
   providing a core circuit board; and
   performing a build-up process to form a build-up structure on a side of the core circuit board, and performing a laminated process to form a laminated structure on another side of the core circuit board opposite to the side having the build-up structure, wherein the laminated structure is formed to counteract warpage of the core circuit board caused by fabrication of the build-up structure, and wherein a number of build-up structures on the core circuit board is greater than a number of laminated structures to form a circuit board having an asymmetrical structure.

2. The method of claim 1, further comprising repeating the build-up process to form more build-up structures on the build-up structure on the side of the core circuit board.

3. The method of claim 1, further comprising repeating the laminated process to form at least one more laminated structure having an improved rigidity on the opposite side of the core circuit board.

4. The method of claim 1, wherein the build-up process is performed prior to the laminated process.

5. The method of claim 1, wherein the laminated process is performed prior to the build-up process.

6. The method of claim 1, wherein the core circuit board has at least two circuit layers.

7. The method of claim 1, wherein the build-up structure comprises at least one insulating layer and at least one patterned circuit layer.

8. The method of claim 7, wherein the insulating layer of the build-up structure is made of a non-fiber resin material.

9. The method of claim 1, wherein fabrication of the build-up structure comprises the steps of forming an insulating layer on the side of the core circuit board; forming in order a conductive layer and a patterned resist layer on the insulating layer, the patterned resist layer having a plurality of openings; electroplating a patterned circuit layer in the openings of the patterned resist layer; and removing the patterned resist layer and the conductive layer underneath the patterned resist layer.

10. The method of claim 1, wherein fabrication of the build-up structure comprises the steps of forming an insulating layer on the side of the core circuit board; forming in order a metal layer having a sufficient thickness and a patterned resist layer on the insulating layer; etching the metal layer to form a patterned circuit layer, and removing the patterned resist layer.

11. The method of claim 9, wherein the insulating layer is coated with a metal layer.

12. The method of claim 10, wherein the insulating layer is coated with a metal layer.

13. The method of claim 1, wherein the laminated structure comprises an insulating layer and a metal layer.

14. The method of claim 13, wherein the insulating layer of the laminated structure is made of a fiber-resin prepreg material.

15. The method of claim 13, wherein the metal layer of the laminated structure is patterned to form a patterned circuit layer.

16. The method of claim 1, wherein the laminated structure is made of a photosensitive polymeric insulating layer.

* * * * *